US010693291B2

(12) United States Patent
Handy et al.

(10) Patent No.: US 10,693,291 B2
(45) Date of Patent: Jun. 23, 2020

(54) METHOD FOR OPERATING AN ELECTRICAL CIRCUIT

(71) Applicant: GE AVIATION SYSTEMS LLC, Grand Rapids, MI (US)

(72) Inventors: Peter James Handy, Cheltenham (GB); Andrew Paul Wyer, Cheltenham (GB)

(73) Assignee: GE AVIATION SYSTEMS LLC, Grand Rapids, MI (US)

(*) Notice: Subject to any disclaimer, the term of this patent is extended or adjusted under 35 U.S.C. 154(b) by 104 days.

(21) Appl. No.: 15/564,242

(22) PCT Filed: Apr. 6, 2015

(86) PCT No.: PCT/US2015/024516
§ 371 (c)(1),
(2) Date: Oct. 4, 2017

(87) PCT Pub. No.: WO2016/163982
PCT Pub. Date: Oct. 13, 2016

(65) Prior Publication Data
US 2018/0131179 A1    May 10, 2018

(51) Int. Cl.
H03K 3/012     (2006.01)
H02H 9/00      (2006.01)
H02H 9/02      (2006.01)
H03K 17/0814   (2006.01)
H03K 17/08     (2006.01)

(52) U.S. Cl.
CPC .......... *H02H 9/005* (2013.01); *H02H 9/002* (2013.01); *H02H 9/025* (2013.01); *H03K 17/08142* (2013.01); *H03K 2017/0806* (2013.01)

(58) Field of Classification Search
CPC ........ H02H 9/002; H02H 9/005; H02H 9/025; H03K 17/08142; H03K 2017/0806
See application file for complete search history.

(56) References Cited

U.S. PATENT DOCUMENTS

| 5,877,564 A | 3/1999 | Kuiri |
| 9,564,810 B2 | 2/2017 | Teo et al. |
| 2004/0257155 A1 | 12/2004 | McEwen |

(Continued)

FOREIGN PATENT DOCUMENTS

| CN | 102037637 A | 4/2011 |
| CN | 103401307 A | 11/2013 |

(Continued)

OTHER PUBLICATIONS

International Search Report and Written Opinion issued in connection with corresponding PCT Application No. PCT/US2015/024516 dated Jan. 7, 2016.

(Continued)

*Primary Examiner* — Alfonso Perez Borroto
*Assistant Examiner* — Esayas G Yeshaw
(74) *Attorney, Agent, or Firm* — McGarry Bair PC

(57) ABSTRACT

A method for operating an electrical circuit for controllably delivering power from a power source to an electrical load including a switch further configured to operate in a first conducting mode and a second non-conducting mode, and a controller, the method includes ceasing delivering power from the power source to the electrical load.

14 Claims, 4 Drawing Sheets

(56) References Cited

U.S. PATENT DOCUMENTS

| | | | |
|---|---|---|---|
| 2006/0028779 A1* | 2/2006 | Bax | H01H 83/226 361/93.1 |
| 2011/0298302 A1* | 12/2011 | Pitigoi-Aron | H01H 9/00 307/125 |
| 2013/0307586 A1* | 11/2013 | O'Connell | H03K 5/1536 327/79 |
| 2015/0188519 A1* | 7/2015 | Singhal | H03K 19/0013 327/199 |

FOREIGN PATENT DOCUMENTS

| | | |
|---|---|---|
| CN | 104079174 A | 10/2014 |
| EP | 1 050 967 A2 | 11/2000 |
| EP | 1 345 326 A2 | 9/2003 |

OTHER PUBLICATIONS

International Preliminary Report on Patentability issued in connection with corresponding PCT Application No. PCT/US2015/024516 dated Oct. 10, 2017.

Chinese Patent Office, Office Action re Chinese Patent Application No. 201580078496.7, dated Oct. 9, 2019, 10 pages, China.

* cited by examiner

METHOD FOR OPERATING AN ELECTRICAL CIRCUIT

BACKGROUND OF THE INVENTION

Electrical circuits can be configured having a switch for controlling an electrical operation, such as enabling or disabling an electrical load. For example, the switch can be controllable to toggle a first mode of operation where the switch is "closed" and current is transmitted from a switch input to a switch output, and a second mode of operation where the switch is "open" and current is prevented from transmitting between the switch input and switch output.

During switching operations, such as switching from a closed state to an open state, the interruption of the current can cause a transient electrical characteristic (i.e. sudden, high voltage and high current spikes beyond normal operating levels). Typically, a transient suppression device can be configured to absorb the transient electrical characteristics in order to protect the electrical circuit from possible damage due to the transient characteristics.

BRIEF DESCRIPTION OF THE INVENTION

In one aspect, a method for operating an electrical circuit includes receiving, by a solid state power controller, a control signal from a controller, and in response to receiving the control signal, toggling, based at least in part on the control signal, a solid state power controller switch toggle between a first conducting mode and a second non-conducting mode within a designated switching time. The toggling between the first mode and the second mode occurs over a time period greater than the designated switching time.

In another aspect, a method for operating an electrical circuit, includes providing a control signal from a controller to a solid state power controller toggle between a first conducting mode and a second non-conducting mode during a designated switching time, and toggling the solid state power controller toggle, based at least in part on the control signal, to switch between the first mode to the second mode. The toggling between the first mode and the second mode occurs over a time period greater than the designated switching time.

In yet another aspect, a control system for operating an electrical circuit includes a solid state power controller having a switch configured to operate in a first conducting mode and a second non-conducting mode, and coupling a power source to an electrical load, and a controller including a temperature component configured to determine the temperature of the solid state power controller, a criteria component configured to determine a set of operating criteria for the solid state power controller, and a timing component configured to determine a timing value for toggling the switch of the solid state power controller based at least in part on the temperature component and criteria component.

DESCRIPTION OF EMBODIMENTS OF THE INVENTION

The described embodiments of the present invention are directed to an electrical circuit such as an electrical power distribution system, which can be used, for example, in an aircraft. While this description is primarily directed toward a power distribution system for an aircraft, it is also applicable to any environment using an electrical circuit having a switchable conduction system tier delivering an electrical signal from a source to a destination.

Figure 1:
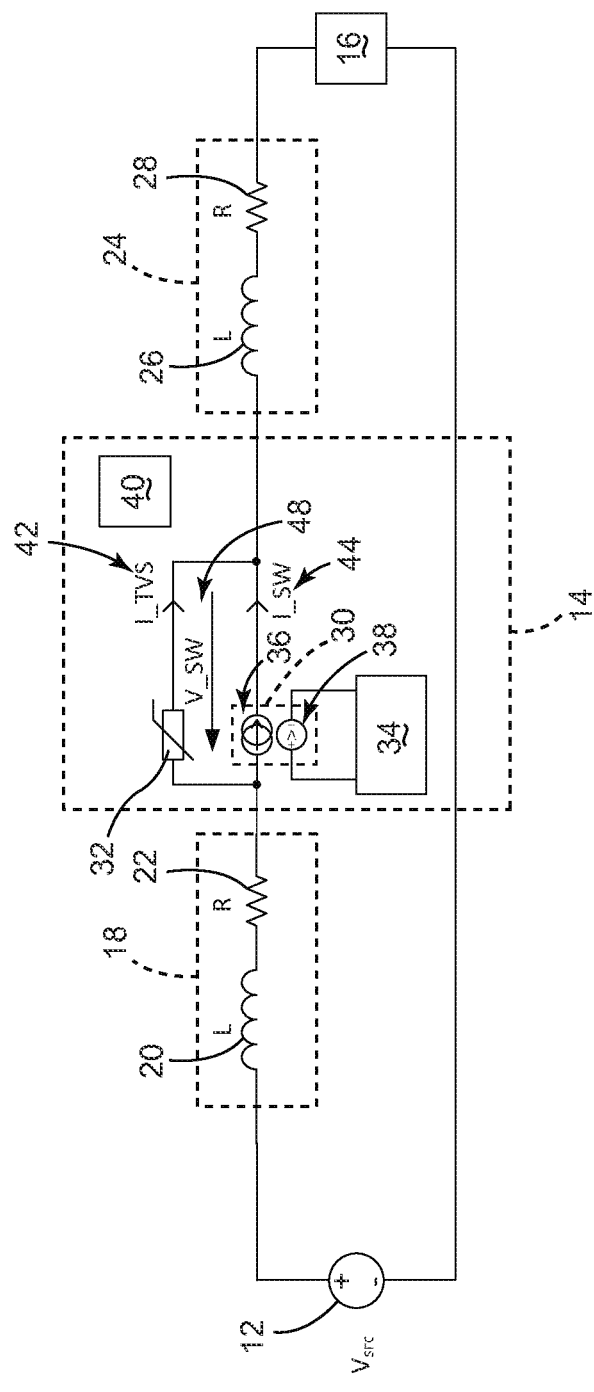
FIG. 1 is a schematic circuit diagram of a power distribution system.

FIG. 1 illustrates an exemplary schematic circuit diagram of an electrical circuit, such as an exemplary power distribution system 10 in an aircraft, comprising a power source, illustrated as a generator 12, an electrical switch, such as a solid state switch or solid state power controller (SSPC) 14, and an electrical load 16. The generator 12 and SSPC 14 are electrically coupled by way of upstream electrical interconnects, such as a first transmission wire 18, having inherent electrical characteristics, for example, a first inductance 20 and a first resistance 22. The SSPC 14 and the electrical load 16 are likewise electrically coupled by way of downstream electrical interconnects, such as a second transmission wire 24, also having inherent electrical characteristics, for example, a second inductance 26 and a second resistance 28. While transmission wires 18, 24 are described, any suitable electrically conductive interconnect can be utilized to couple the generator 12, SSPC 14, and electrical load 16. Non-limiting examples of suitable electrically conductive interconnects can include cables, cable junctions, or bus bars.

One example of the SSPC 14 can comprise a silicon carbide (SiC) or Gallium Nitride (GaN) based, wide bandgap power switch. SiC or GaN can be selected based on their solid state material construction, their ability to handle large power levels in smaller and lighter form factors, and their high speed switching ability to perform electrical operations very quickly. Another example of the SSPC 14 can comprise further silicon-based power switch, such as a metal-oxide-semiconductor field-effect transistor (MOSFET) also capable of high speed switching.

The SSPC 14 can include a switching component 30, a transient suppression device configured across the switching component 30, and a controller 34. The transient suppression device can include, but is not limited to, a Transient Voltage Suppressor (TVS) 32, transorb, or metal oxide varistor (MOV) device. The switching component 30 can include virtually any component that is capable of controllably operating, or controllably changing between a first conducting mode and a second non-conducting mode in response to a control signal. In the illustrated example, the switching component 30 further includes a voltage controlled current source (VCCS) 36 that is controllable in response to a control signal 38 generated by the controller 34. While the example shown illustrates the controller 34 as a subcomponent of the SSPC 14, embodiments of the invention can include examples wherein the controller 34 is external to the SSPC 14, and can provide the control signal 38 to at least one of the SSPC 14, switchable component 30, or VCCS 36.

The SSPC 14 can include a temperature sensor 40 that senses, measures or otherwise determines a temperature value associated with at least one of the switching component 30 or TVS 32. For example, the temperature value can include an actual temperature of switching component 30 or TVS 32. Additionally or alternatively, the temperature value can include a value indicative of or related to the temperature of the SSPC 14 or the controller 34. The temperature sensor 40 can be communicatively coupled with the controller 34. The temperature sensor 40 can transmit, indicate, or otherwise provide the temperature value (e.g., as respective current or voltage characteristics) to a further component, such as the controller 34, and the controller 34 performs processing on the characteristics to determine, for instance, a temperature or change in temperature value. Additionally or alternatively, the temperature sensor 40 can be integrated with the controller 34. Non-limiting examples of determining a temperature value are described herein, with reference to FIG. 4.

FIG. 1 further illustrates several electrical characteristics of the power distribution system 10, which will be demonstrated in later figures. Illustrated electrical characteristics include the current through the TVS 42, the current through the VCCS 44, the voltage drop across the TVS and VCCS 48.

The VCCS 36 can, for example, operate, change, or otherwise control the switch based on the control signal 38, such that the VCCS 36 operates in a substantially binary fashion, wherein the first conducting mode allows the uninhibited conduction of current through the SSPC 14 or VCCS 36, and wherein the second non-conducting mode prevents conduction of current through the SSPC 14 or VCCS 36. In this instance, the VCCS 36 can switch between the first and second modes over a very short designated switching time. The designated switching time can, for example, be based on a minimum switching time of the device. For instance, the minimum switching time can be on the order of 10 nanoseconds.

As an additional example, the VCCS 36 can further operate, change, or otherwise control the switch based on the control signal 38, such that the VCCS 36 operates in a controllably tailored fashion. For instance, the first conducting mode can allow for varying levels of current conduction in a varying conduction mode over a period of time. The varying conduction mode can include a linear conduction mode such that the level of current conduction through the SSPC 14 or VCCS 36 can be proportional to the control signal 38. Additionally or alternatively, the varying conduction mode includes a predetermined conduction schema. For instance, the predetermined conduction schema can include a non-linear conduction mode, a stepping conduction mode, such as a step-down conduction mode, or any combination of schemas. In this example, switching from the first conducting mode to the second non-conducting mode can controllably lower the current conduction through the SSPC 14 or VCCS 36 over a period of time, longer than designated switching time previously described (e.g., 10 microseconds). Additionally, switching from the second mode to the first mode can be based on the control signal 38, or based on the predetermined conduction schema. Additional varying conduction modes can include, for example, a rising or falling geometric conduction mode.

Examples of the controller 34 can further include a general purpose or special purpose computer or other machine with a processor. Generally, such a computer program can include routines, programs, objects, components, data structures, algorithms, etc. that have the technical effect of performing particular tasks or implement particular abstract data types. Machine-executable instructions, associated data structures, and programs represent examples of program code for executing the exchange of information as disclosed herein. Machine-executable instructions can include, for example, instructions and data, which cause a general purpose computer, special purpose computer, or special purpose processing machine to perform a certain function or group of functions. Embodiments of the invention can include examples wherein the conduction algorithm, pattern, or controllable modes can be stored in memory of the controller 34 or external memory accessibly by the controller 34. Examples of memory can include random access memory (RAM), read-only memory (ROM), flash memory, or one or more different types of portable electronic memory, such as discs, DVDs, CD-ROMs, etc., or any suitable combination of these types of memory. The memory can include all or a portion of a computer program having an executable instruction set for determining the conduction algorithm, pattern, or controllable modes.

In an aircraft embodiment, for example, an operating gas turbine engine can provide mechanical energy which can be extracted via a spool, to provide a driving force for the generator 12. The generator 12, in turn, provides the generated power to the SSPC 14, which delivers the power to the electrical loads 16, via the respective transmission wires 18, 24, when the switching component 30 is closed (i.e., in the first conducting mode). The power distribution system 10 can further operate or change the switch from the first conducting mode to the second non-conducting mode by providing the control signal 38 from the controller 34 to at least one of the SSPC 14, switching component 30, or VCCS 36 indicative of ceasing delivering power from the generator 12 to the electrical load 16. In response to the control signal 38, the switching component 30 controllably toggles from the first conducting mode to the second non-conducting mode, until the delivering of power has ceased.

When the switching component 30 is near-instantaneously opened, (i.e. switched to the second non-conducting mode) such as in the designated switching time example above, the interruption of the current in the power distribution system 10 causes a transient electrical characteristic (i.e. sudden, high voltage and high current spikes beyond normal operating levels) in the power distribution system 10 at the SSPC 14 due to the inherent electrical characteristics, such as the first and second inductances 20, 26, of the respective first and second transmission wires 18, 22. In some electrical systems, or aircraft power distribution systems 10, and the transmission wires 18, 22 can be miles long, which results in significant inductances 20, 26, and resultantly, significant electrical transients at the SSPC 14 during near-instantaneous switching over a very short period of time such as the designated switching time. Furthermore, some power distribution systems 10 operate at high voltage levels, for example 270 VDC, or high current levels, such as 100 Amps, which further exacerbates the high levels of the electrical transients. For example, the energy stored in the first and second transmission wires 18, 24 can be on the order of tens of Joules, which will cause a large transient electrical characteristic in the embodiments of the invention.

In embodiments wherein the switching component 30 is near-instantaneously opened, such as in the designated switching time example above, the transient electrical characteristic is mainly absorbed and dissipated across the TVS 32 so as to not damage the SSPC 14 or switching component 30. The transient electrical characteristic is typically dissipated across the TVS 32 as heat, which can be further dissipated from the TVS 32 to, for example, a heat sink, or via convection to the external environment. This configuration and operation, thus requires a larger, more robust, or more capable TVS 32 configured to handle power transients greater than 600 kW, and current transients greater than 500

Amps, in one example. While one example electrical transient is described, higher and lower voltage or current transients can be included, and can depend on the electrical characteristics of the electrical circuit.

Alternatively, in embodiments of the invention wherein the switching component 30 is controllably opened (i.e. switched to the second non-conducting mode) over a period of time slower than the designated switching time, the transient electrical characteristic is reduced due to: first, elongating the amount of time in which the current conduction of the switching component 30 is ceased, and thus, reducing the instantaneous transient experienced at any given moment during the period of time; and second, by absorbing the transient experienced over both the TVS 32 and the switching component 30 or SSPC 14. In this example, the transient is typically dissipated across both the TVS 32 and the switching component 30 or SSPC 14 as heat, which can be further dissipated from the components 32, 30, 14 to, for example, a heat sink, or via convection to the external environment. By absorbing the transient experienced over both the TVS 32 and the switching component 30 or SSPC 14, the TVS 32 can be configured to be smaller, less robust, or less capable to handle smaller power transients less than 350 kW, and current transients less than 350 Amps, in a similar example as explained above.

Figure 2:
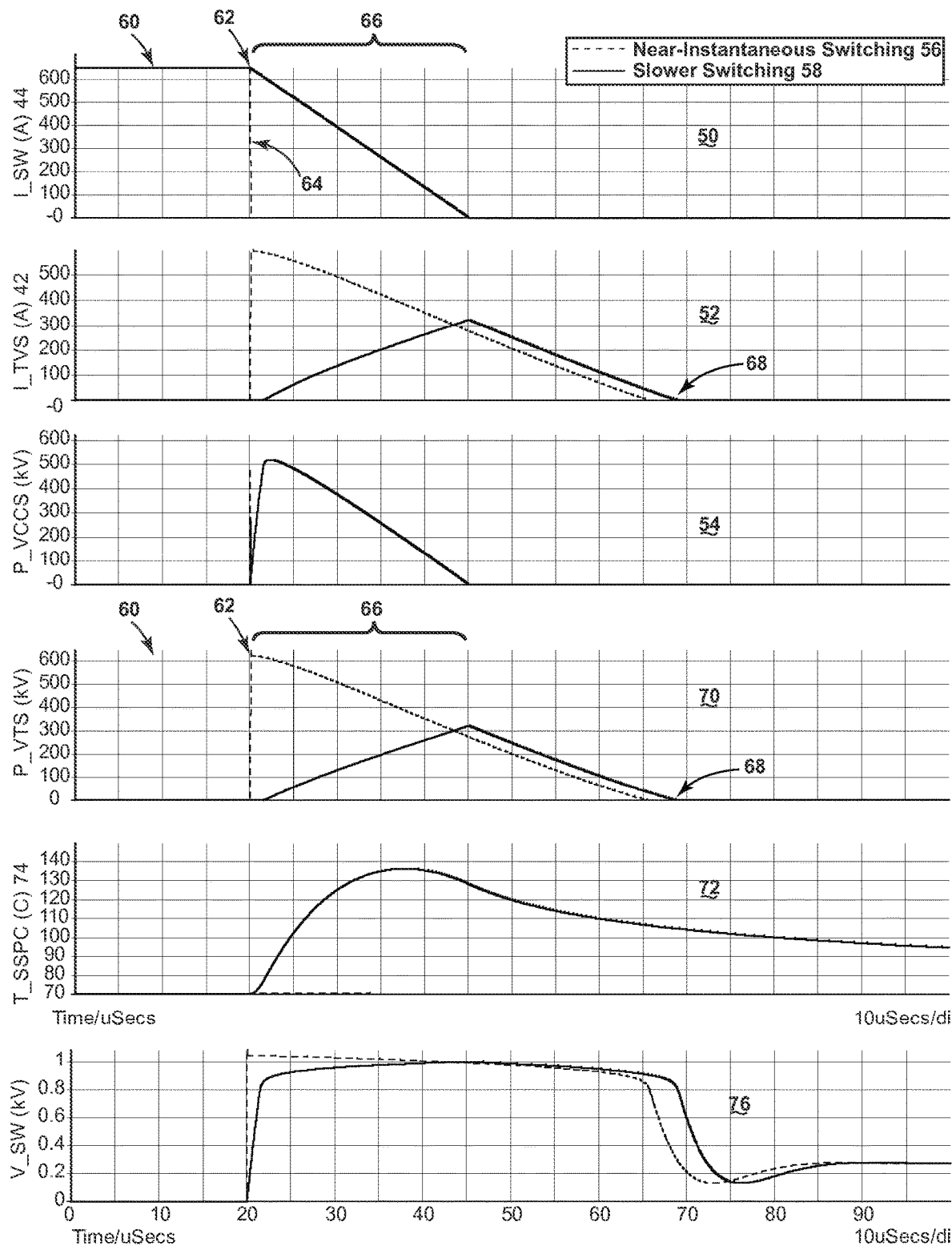
FIG. 2 is a series of graphs showing the response of the method of operating the power distribution system.

FIG. 2 illustrates a number of time-aligned electrical response graphs showing the operation of both the first and second examples explained above. In FIG. 2, a first graph 50 illustrates the current through the VCCS 44 (denoted I_SW, as measured in Amps), a second graph 52. illustrates the current through the TVS 42 (denoted I_TVS, as measured in Amps), a third graph 54 illustrates the power dissipated in the VCCS 36 (denoted P_VCCS, as measured in kW), a fourth graph 70 illustrates the power dissipation in the TVS (denoted P_TVS, as measured in kW), a fifth graph 72 illustrating a corresponding temperature profile 74 of the SSPC 14 or switching component 30 (denoted as T_SSPC, as measured in degrees Celsius), and a sixth graph 76 illustrating a clamp voltage, as measured across the switching component 30 (denoted V_SW, as measured in kV), due to the electrical stress applied to the TVS 32 during the method. The first example above, wherein the switching component 30 is near-instantaneously opened, such as in the designated switching time, has been illustrated as a first signal 56, while the second example above, wherein the switching component 30 is controllably opened over a period of time slower than the designated switching time, has been illustrated as a second signal 58.

As illustrated, at the start of the method 60, the switching component 30 is dosed and the switching component 30 is conducting more than 600 Amps from the generator 12 to the electrical load 16. At a second time 62, the controller 34 provides a control signal 38 to the SSPC 14 indicative of ceasing delivering power from the generator 12 to the electrical load 16, and the VCCS 36 responds by switching from a first conducting mode to a second non-conducting mode.

As shown in the first signal 56 of the first graph 50, the VCCS current 44 is near-instantaneously ceased 64, while the first signal 56 of the second graph 52 shows a transient electrical characteristic, or spike, in TVS current 42, corresponding with the second time 62, which dissipates over time. The first signal 56 of the third graph 54 shows that while there is a temporary transient in VCCS 36 power corresponding with the second time 62, the transient is quickly eliminated as the VCCS 36 is opened and thus, non-conducting.

Compare the example of the first signal 56 response with the example of the second signal 58 response. At the second time 62, the VCCS 36 is controllably operated to change from the first conducting mode to the second non-conducting mode over a period of time 66 slower than the designated switch time, until the delivering of power has ceased. As shown in the second signal 58 of the first graph 50, the VCCS current 44 is linearly reduced over the period of time 66, As explained above, while a linearly reducing conduction mode is illustrated, additional varying conduction modes can be included in embodiments of the invention.

While the VCCS current 44 reduces over the period of time, the VCCS 36 power, as shown in the third graph 54 first rises in response to the smaller electrical transient in the system 10, then reduces until the switching component 30 is fully opened in a non-conducting mode. During this same period of time, the TVS current 42, as shown in the second graph 52, rises over the period of time 66, as the amount of VCCS current 44 is reduced. During this period of time 66, both the VCCS 36 and the TVS 32 are absorbing and dissipating the electrical transient caused by the changing electrical transmission of the power distribution system 10. At the completion of the period of time 66, all remaining electrical transient characteristics are being absorbed and dissipated by the TVS 32 alone, as the second graph 52 shows the dissipating TVS current 42 until the time at which transient has subsided 68.

As shown in the first signal 56 of the fourth graph 70, the TVS power dissipation shows a transient in TVS power at the moment the switching component 30 switches from the first conducting state to the second non-conducting state, corresponding with the second time 62, wherein a significant majority of the transient electrical characteristic is absorbed by the TVS 32, and dissipates, as heat, over time. Conversely, as shown in the second signal 58, the TVS power dissipation, as shown in the fourth graph 70, rises over the period of time 66, as the amount of power dissipated in the VCCS 36 is reduced during the same period 66 (as shown in the corresponding third graph 54). At the completion of the period of time 66, all remaining transient electrical characteristics are being absorbed and dissipated by the TVS 32 alone, as the fourth graph 70 shows a reduction in in the TVS power dissipation 42 until the time at which transient has subsided 68.

The fifth graph 72 illustrates one example temperature profile 74 of the SSPC 14 during the example of the second operation, wherein the switching component 30 is controllably opened over a period of time slower than the designated switching time. As illustrated by the second signal 58, a temperature increase in the SSPC 14 corresponds with the second time 62, as a portion of the transient electrical characteristics are absorbed by the SSPC 14, and primarily dissipated as heat. After a portion of the period of time 66, the transient electrical characteristics are minimized, and the temperature of the SSPC 14 begins to subside as, for example, heat is further dissipated away from the SSPC 14 by way of a heat sink, convection to the external environment, or other dissipation methods.

The sixth graph 76 illustrates one example of a clamp voltage, as measured across the switching component 30, due to the electrical stress applied to the TVS 32 during the method. As shown in the first signal 56, a high level of electrical stress (shown in kV) is applied across the TVS 32 due to the near-instantaneous switching transient characteristics. Conversely, as shown in the second signal 58, by applying the stress over a longer period of time, according to embodiments of the disclosure, the TVS 32 is subjected to a reduced stress, and resultantly, a smaller peak clamp voltage occurs during the switching operations. The smaller peak clamp voltage can further minimize the effects of any parasitic inductance in the TVS 32 wiring.

Embodiments of the invention can include configurations of the SSPC 14, TVS 32, or the varying conduction mode, pattern, or schema wherein the configurations can be selected such that the expected, estimated, or actual temperature profile of the SSPC 14 does not meet or exceed a thermal failure threshold value for one or more of the aforementioned components 14, 32, during the period of time 66, or during repeated switching from conducting to non-conducting modes. For example, the method of controllably delivering or interrupting power from the generator 12 to the electrical load 16 can further include tailoring or calculating the varying conduction mode, pattern, algorithm, or period of time 66 at least partially based on an estimated amount of heat generated by the dissipating of heat in at least one of the SSPC 14 or TVS 32, and an estimated or actual rate of heat dissipation by at least one of the SSPC 14 or TVS 32. In this example, the temperature sensor 40 can provide measurements, estimates, or signals indicative of heat dissipation into or away from the SSPC 14 or TVS 32. In such an embodiment, the controller 34 can controllably provide the control signal 38 to at least one of the SSPC 14 or the switching component 30 indicative of the calculated or estimated period of time 66.

Figure 3:
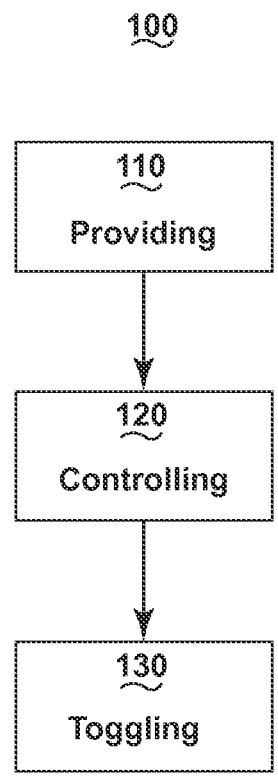
FIG. 3 is a flowchart showing a method of operating the power distribution system.

FIG. 3 demonstrates a non-limiting example method 100 for operating the electrical circuit to controllably deliver power from a power source, such as a generator 12, to an electrical load 16. The method 100 begins with a providing step 110, wherein the controller 34 provides a control signal 38 to at least one of the SSPC 14 or switching component 30. Next is a controlling step 120 wherein the controller 34 operably controls at least one of the SSPC 14 or switching component 30, based at least in part on the control signal 38, to toggle from the first conducting mode to the second non-conducting mode. In one non-limiting example, the controller 34 can further operate to control the SSPC 14 or switching component 30 based at least in part by further determining a heat dissipation due to the toggling from the first mode to the second mode, such as by determining the heat dissipation due to transient electrical characteristics applied to at least one of the SSPC 14, the switching component 30, or the TVS 32.

In another non-limiting example embodiment of the invention, the controller 34 can further operate to control the SSPC 14 or switching component 30 by determining the period of time for toggling from the first mode to the second mode, based at least in part on the determination of the heat dissipation. Further yet, the determination of the period of time can be based at least in part on preventing the SSPC 14, switching component 30, or the TVS 32 from satisfying a thermal failure threshold value for each respective component (i.e. overheating), as explained above. The determination of the period of time can also be based at least in part on a desired clamp voltage applied to the TVS 32, also explained above. Finally, in a toggling step 130, the SSPC 14 or switching component 30 toggles from the first conducting mode to the second non-conducting mode over the period of time, according the control signal 38.

The sequence depicted is for illustrative purposes only and is not meant to limit the method 100 in any way as it is understood that the portions of the method can proceed in a different logical order, additional or intervening portions can be included, or described portions of the method can be divided into multiple portions, or described portions of the method can be omitted without detracting from the described method.

Figure 4:
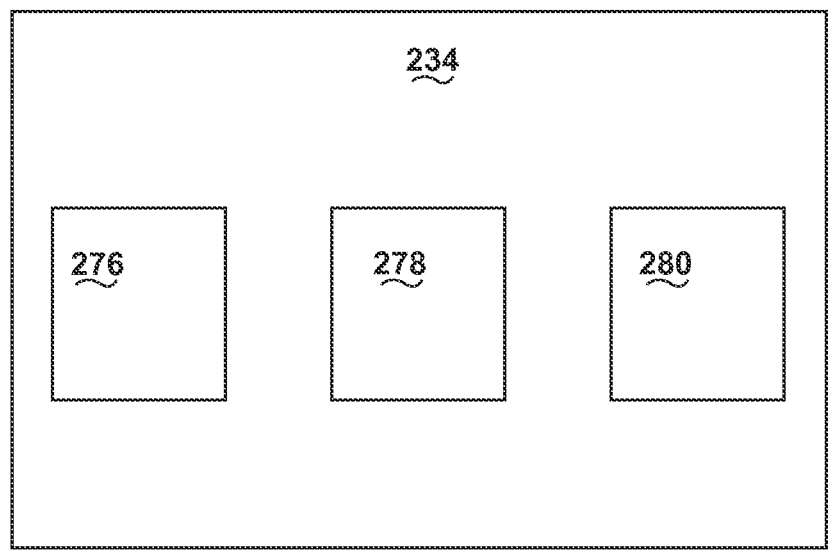
FIG. 4 is a controller for the power distribution system, according to a second embodiment of the invention

FIG. 4 illustrates an alternative controller 234 according to a second embodiment of the invention. The second embodiment is similar to the first embodiment; therefore, like parts will be identified with like numerals increased by 200, with it being understood that the description of the like parts of the first embodiment applies to the second embodiment, unless otherwise noted. A difference between the first embodiment and the second embodiment is that the controller 234 can further include a temperature component 276, a criteria component 278, and a timing component 280. The temperature component 276 can be configured to determine or estimate the temperature of the SSPC 14, switching component 30, or the TVS 32. In one embodiment of the invention, the temperature component 276 can include, but is not limited to, a temperature sensor, a predetermined temperature model, an estimation temperature model, sensing or measuring the current or voltage across the SSPC 14, switching component 30, or the TVS 32, or any combination of the above-mentioned examples.

The criteria component 278 can determine or acquire a set of operating criteria for SSPC 14, switching component 30, or the TVS 32. Example operating criteria for the SSPC 14, switching component 30, or the TVS 32 can include, but are not limited to, type of switching component 30, power rating of the respective components 14, 30, 32, thermal failure threshold values, desired clamp voltage of the TVS 32, heat dissipation rates of the respective components 14, 30, 32, or heat generation rates of the respective components 14, 30, 32. In one example, the criteria component 278 can acquire the respective operating criteria from a database or table of values.

The timing component 280 can be configured to determine the period of time for toggling the SSPC 14 or the switching component 30 from the first conducting mode to the second conducting mode, and can base the determination at least in part on at least one of the temperature component 276 or the criteria component 278. For example, the timing component 280 can generate a period of time, a timing set point, or a timing value based on at least a set of temperature or criteria, as described above. In one instance, the timing component 280 can utilize the temperature of the TVS 32, as determined by the temperature component 276, the expected rate of heat generation in the TVS 32 when exposed to an estimated electrical transient characteristic, and the expected rate of heat dissipation of the TVS 32 to generate a toggling period of time that prevents the TVS 32 from reaching or exceeding a the thermal failure threshold value of the TVS 32. Additional considerations for determining the period of time for toggling the SSPC 14 or the switching component 30 have been described herein.

Many other possible embodiments and configurations in addition to that shown in the above figures are contemplated by the present disclosure. For example, one embodiment of the invention contemplates ensuring the total period of time to controllably operate or change the switching component 30 from the first conducting state to the second non-conducting state, and back to the first conducting state, can be less than a power-interruption reset time of the electrical load 16. Additionally, the design and placement of the various components can be rearranged such that a number of different in-line configurations could be realized.

The embodiments disclosed herein provide a method for operating an electrical circuit for controllably delivering power from a power source to an electrical load coupled via a solid state power controller. One advantage that can be realized in the above embodiments is that the above described embodiments can operate with controllable transient electrical characteristic management during switching events. Transient suppression devices are physically large, expensive, and unreliable devices. Thus, by accurately controlling the transient electrical characteristic generated during switching, the effect of the transient can be shared between both the transient suppression device as well as the SSPC and therefore the required transient suppression device rating can be reduced, or in some instances, eliminated completed. A lower rated transient suppression device, or alternatively, eliminating the transient suppression device reduces the weight and size requirements compared to the conventional type SSPC transient electrical characteristic management systems. Further reducing the applied stress to the transient suppression device, or alternatively, eliminating the transient suppression device further increases the overall reliability of the electrical circuit. Additionally, by reducing the applied stress to the transient suppression device, a smaller clamp voltage occurs during the switching operations, which can further minimize the effects of any parasitic inductance in the transient suppression device wiring. Moreover, by reducing the clamp voltage and minimizing the effects of parasitic inductances on the transient suppression device wiring, the transient suppression device can have more freedom to be physically located away from the designated design of the SSPC without additional negative inductive effects.

When designing aircraft components, important factors to address are size, weight, and reliability. The proposed method for operating an electrical circuit results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for operating an electrical circuit, comprising:
   determining a thermal failure threshold value of at least one of a solid state power controller or a transient suppression device;
   determining heat dissipation of the at least one of the solid state power controller or the transient suppression device, due to the toggling from the first mode to the second mode;
   determining a time period based at least in part on the determined heat dissipation and the determined threshold value;
   receiving, by a solid state power controller, a control signal from a controller; and
   in response to receiving the control signal, toggling, based at least in part on the control signal, a solid state power controller switch toggle between a first conducting mode and a second non-conducting mode within a designated switching time;
   wherein the toggling between the first mode and the second mode occurs over the time period, and wherein the time period is greater than the designated switching time.

2. The method of claim 1, further comprising controlling a voltage controlled current source based at least in part on the control signal.

3. The method of claim 2 wherein the controlling the voltage controlled current source further includes controlling the voltage controlled current source in a linear conduction mode over the time period.

4. The method of claim 1 wherein the receiving the control signal includes receiving the determined time period.

5. The method of claim 1 wherein the determining heat dissipation includes determining heat dissipation by the switch and a transient suppression device.

6. The method of claim 5 further comprising, wherein the determining the heat dissipation includes estimating, by the controller, an amount of heat generated by the dissipating and estimating, by the controller, a rate of heat dissipation by at least one of the solid state power controller or the transient suppression device.

7. The method of claim 1 further comprising:
   receiving a second control signal;
   and in response to receiving the second control signal, toggling, based at least in part on the second control signal, the solid state power controller switch toggle between the second conducting mode and the first conducting mode during a second period of time, wherein the total cycle time for toggling the solid state power controller switch in response to the first and second control signals is less than a power-interruption reset time of the electrical load.

8. A method for operating an electrical circuit, comprising:
   determining, by a controller, heat dissipation due to transient electrical characteristics applied to at least one of a solid state power controller or a transient suppression device and due to a toggling from a first mode to a second mode;
   providing a control signal from the controller to a solid state power controller toggle between a first conducting mode and a second non-conducting mode during a designated switching time; and
   toggling the solid state power controller toggle, based at least in part on the control signal and the determined heat dissipation, to switch between the first mode to the second mode;
   wherein the toggling between the first mode and the second mode occurs over a time period greater than the designated switching time.

9. The method of claim 8 further comprising determining, by the controller, the time period based at least in part on heat dissipation.

10. The method of claim 9 wherein the determining the time period further comprises determining the time period based at least in part on preventing the at least one of the solid state power controller or the transient suppression device from satisfying a thermal failure threshold.

11. The method of claim 8 further comprising determining, by the controller, a time period based at least in part on a desired clamp voltage applied to a transient suppression device.

12. A control system for operating an electrical circuit, comprising:
   a solid state power controller having a switch configured to operate in a first conducting mode and a second non-conducting mode, and coupling a power source to an electrical load; and
   a controller, comprising:
      a temperature component configured to determine the temperature of the solid state power controller and a heat dissipation of the solid state power controller;
      a criteria component configured to determine a set of operating criteria for the solid state power controller including at least a thermal failure threshold value of the solid state power controller; and
      a timing component configured to determine a timing value for toggling the switch of the solid state power controller based at least in part on the temperature component and criteria component.

13. The control system of claim 12 wherein the controller is communicatively coupled with the solid state power controller and provides a control signal indicating the timing value to the solid state power controller.

14. The control system of claim 13 wherein the solid state power controller operates between the first conducting mode and the second non-conducting mode in response to the control signal.

* * * * *